United States Patent [19]
Jaouen et al.

[11] Patent Number: 6,100,595
[45] Date of Patent: Aug. 8, 2000

[54] SEMICONDUCTOR DEVICE HAVING OPTOELECTRONIC REMOTE SIGNAL-EXCHANGE MEANS

[75] Inventors: Hervé Jaouen, Meylan; Michel Marty, Varces, both of France

[73] Assignee: STMicroelectronics S.A., Gentilly, France

[21] Appl. No.: 09/105,735

[22] Filed: Jun. 26, 1998

[30] Foreign Application Priority Data

Aug. 18, 1997 [FR] France .................................. 97 10429

[51] Int. Cl.⁷ .......................... H01L 23/14; H01L 33/00; G02B 6/42; G02B 6/30
[52] U.S. Cl. .......................... 257/778; 257/737; 257/738; 257/692; 257/693; 257/84; 257/81; 257/116; 257/100; 257/98; 257/432; 257/434; 385/92; 385/94; 385/65
[58] Field of Search .................................. 257/678, 692, 257/693, 737, 738, 777, 778, 774, 680, 704, 431, 433, 79, 84, 80–82, 116, 117, 432, 100, 98, 622, 434; 385/49, 14, 52, 65, 94, 92

[56] References Cited

U.S. PATENT DOCUMENTS

| | | | |
|---|---|---|---|
| 4,826,272 | 5/1989 | Pimpinella et al. | 385/92 |
| 5,155,786 | 10/1992 | Ecker et al. | 385/94 |
| 5,345,529 | 9/1994 | Sizer et al. | 385/147 |
| 5,394,490 | 2/1995 | Kato et al. | 385/14 |
| 5,424,573 | 6/1995 | Kato et al. | 257/431 |
| 5,625,733 | 4/1997 | Frigo et al. | 385/88 |
| 5,909,524 | 6/1999 | Tabuchi | 385/49 |

FOREIGN PATENT DOCUMENTS

| | | |
|---|---|---|
| 0305112 | 3/1989 | European Pat. Off. . |
| 0726477 | 8/1996 | European Pat. Off. . |

OTHER PUBLICATIONS

*Optical Module with MU Connector Interface Using Self–alignment Technique by Solder–bump Chip Bonding*—1996 Electronic Components and Technology Conference–Hayashi et al, XP000646648 May 28, 1996.
*Active Atmosphere Solder Self–alignment and Bonding of Optical Components*—International Journal of Microcircuits and Electronic Packaging 16(1993)Second Quarter, No.2, Reston, VA US.
French Search Report.

*Primary Examiner*—Alexander O. Williams
*Attorney, Agent, or Firm*—Theodore E. Galanthay; Stephen Bongini; Fleit, Kain, Gibbons, Gutman & Bongini P.L.

[57] ABSTRACT

A semiconductor device includes a chip forming an integrated circuit; a connection substrate; an internal coupling mechanism; and at least one optical communication system. The connection substrate comprises an external coupling mechanism for electrically coupling to a device other than the chip. The internal coupling mechanism electrically couples the integrated circuit to the external coupling mechanism. The at least one optical communication system comprises two optoelectronic parts. The first optoelectronic part is either an emitter or a receiver which is integrated into the chip and constitutes one component of the integrated circuit. The second optoelectronic part is borne by the connection substrate and is able to be externally connected to the connection substrate. The second optoelectronic part faces the first optoelectronic part and is capable of exchanging light signals with the first optoelectronic part.

18 Claims, 2 Drawing Sheets

SEMICONDUCTOR DEVICE HAVING OPTOELECTRONIC REMOTE SIGNAL-EXCHANGE MEANS

CROSS-REFERENCE TO RELATED APPLICATIONS

This application is based upon and claims the benefit of the priority of the prior French patent application 9710429 filed on Aug. 18, 1997, the contents of which are incorporated herein.

BACKGROUND OF THE INVENTION

1. Field of the Invention

The present invention relates to the field of microelectronics and more particularly to a semiconductor device comprising a chip, forming an integrated circuit, and a connection substrate, in which connection balls or points for connecting the substrate to the chip are provided between the juxtaposed faces of the chip and the substrate and are distributed in the form of a matrix, and in which the substrate has external-connection means which are connected to the said connection balls.

2. Description of the Related Art

Another U.S. Pat. Application dealing with related technology has been filed on even date herewith. That application is entitled "Semiconductor Device having Separated Exchange Means" by Herve Jaouen and Michel Marty and is assigned to SGS-Thomson Microelectronics, with a docket number of 97-CC-039.

SUMMARY OF THE INVENTION

Briefly, according to an aspect of the invention, a semiconductor device includes a chip, forming an integrated circuit; a connection substrate; an internal coupling mechanism; and at least one optical communication system. The connection substrate comprises an external coupling mechanism for electrically connecting to a device other than the chip. The internal coupling mechanism electrically couples the integrated circuit to the external coupling mechanism. The at least one optical communication system comprises two optoelectronic parts. The first optoelectronic part is either an emitter or a receiver which is integrated into the chip and constitutes one component of the integrated circuit. The second optoelectronic part is borne by the connection substrate and is able to be externally connected to the connection substrate. The second optoelectronic part faces the first optoelectronic part and is capable of exchanging light signals with the first optoelectronic part.

DETAILED DESCRIPTION OF AN EMBODIMENT

1. Overview

A semiconductor device according to an embodiment of the invention comprises a chip, forming an integrated circuit and a connection substrate, in which connection points or balls, distributed in the form of a matrix, are provided between the juxtaposed faces of the chip and of the substrate and in which the substrate has means of external connection which are connected to the connection points.

According to an embodiment of the invention, the semiconductor device furthermore comprises at least one light-signal-exchange means comprising two optoelectronic parts which respectively comprise at least one emitter and at least one receiver which are placed a certain distance apart, facing each other and capable of exchanging light signals between them, one of the parts being integrated into the chip and constituting one component of the integrated circuit and the other part being borne by the substrate and being able to be externally connected to the substrate.

According to an embodiment of the invention, the exchange means may advantageously be placed in a region having no connection points.

According to a preferred variant of the invention, that part of the exchange means which is borne by the substrate comprises at least one optical fiber, the end part of which is engaged through an orifice passing through the substrate and formed so as to couple, optically and remotely, the end of the fiber to that part of the exchange means which is integrated into the chip, through the space separating the chip from the substrate.

According to an embodiment of the invention, the orifice preferably extends perpendicularly to the space separating the chip from the substrate.

According to an embodiment of the invention, the orifice may advantageously have axial grooves in its wall.

According to an embodiment of the invention, the end part of the fiber is preferably adhesively bonded in the orifice to the substrate.

According to an embodiment of the invention, a sealing resin is preferably injected into the space separating the chip from the substrate and is transparent to the light signals, this resin adhesively bonding the fiber to the substrate.

According to an embodiment of the invention, that part of the exchange means constituting one component of the integrated circuit is, preferably in the thickness direction of the chip, a final component of this circuit.

According to an embodiment of the invention, the means for connecting the substrate preferably comprises external-connection pads or balls distributed in the form of a matrix on its surface opposite the chip.

According to an embodiment of the invention, the substrate may advantageously consist of one portion of the wall of a package for encapsulating the chip.

2. Description

Figure 1:
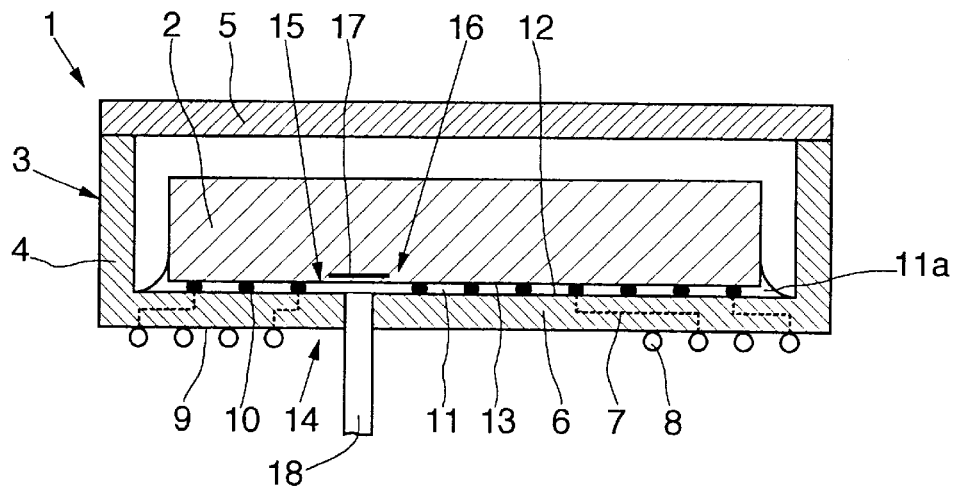
FIG. 1 represents a diagrammatic cross-section of a semiconductor device according to an embodiment of the invention.

Shown in FIG. 1 is a semiconductor device 1, which comprises a chip 2 forming an integrated circuit, encapsulated in a package 3 which comprises a holder 4 and a lid 5.

The bottom 6 of the holder 4 consists of a substrate integrating a multiplicity of connection lines 7 connecting external-connection balls 8 arranged on the external face 9 of the wall 6 to connection balls 10 interposed in the space 11 separating the internal face 12 of the wall 6 of the package 3 from the front face 13 of the chip 2, these balls 10 being connected to the integrated circuit in the chip 2.

The external-connection balls 8 and the internal-connection balls 10 are distributed in the form of a matrix, leaving corresponding regions 14 and 15 lying on each side of the wall 6 of the package 3 free of balls and free of internal connections in this wall 6.

In the regions 14 and 15 that are free of balls, the semiconductor device 1 comprises an optoelectronic lightsignal-exchange device 16 in two parts, one part 17 of which constitutes a component of the integrated circuit in the chip 2 and the other part 18 of which is borne by the wall 6 of the package 3, these parts 17 and 18 being capable of exchanging light signals across the space 11 separating the chip 2 from the wall 6 of the package 3.

Figure 2:
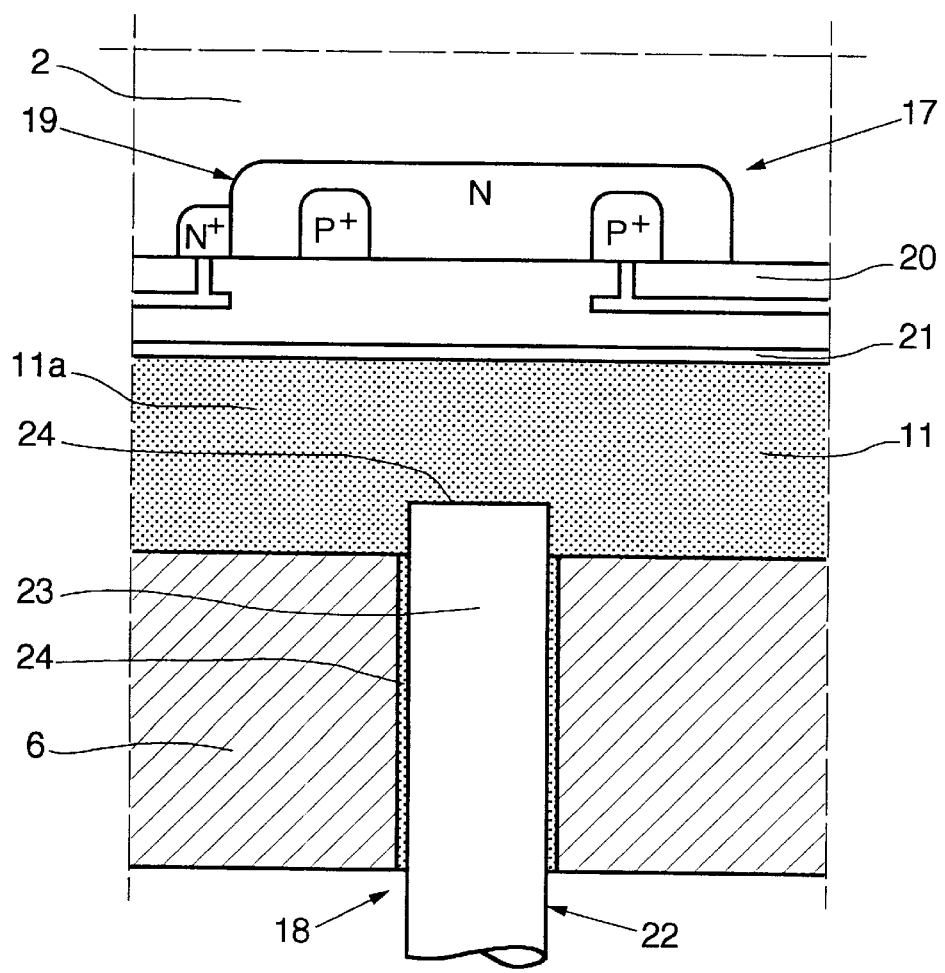
FIG. 2 represents an enlarged section of FIG. 1, showing a first embodiment of a semiconductor device according to an embodiment of the present invention.

The embodiment in FIG. 2 shows that the part 17 comprises an optoelectronic receiver 19 consisting of, for example, a light-sensitive diode, constituting a component of the integrated circuit in the chip 2. This diode constitutes a final component in the thickness direction of the chip and is produced to the rear of an insulating layer 20 of silicon dioxide and of a passivating surface layer 21.

The part 18 borne by the wall 6 of the package 3 comprises an optical fiber 22, an end part 23 of which is engaged in an orifice 24 passing through the wall 6, produced in its thickness direction, perpendicularly to the space 11, in such a way that its end 25 is oriented towards the receiving diode 19 integrated into the chip 2.

The optical fiber 22 has, on the outside of the semiconductor device 1, a free branch the end of which may be adapted in order to be connected to a light-signal emitter, the optical fiber 22 conveying these signals as far as its end 25 which constitutes an emitter coupled to the receiving diode 19 through the space 11 separating the chip 2 from the wall 6 of the package 3. The signals thus picked up by the receiving diode 19 are converted by the latter into electrical signals which can be processed by other components integrated into the chip 2.

Figure 4:
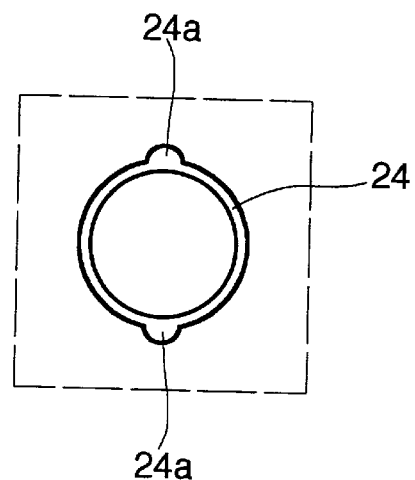
FIG. 4 represents a partial external view of the semiconductor device of FIGS. 2 and 3.

As may be seen in FIG. 4, the wall of the orifice 24 passing through the wall 6 of the package 3 and receiving the end 23 of the fiber 22 has axial grooves 24a. Injected into the space 11 separating the chip 2 from the wall 6 of the package 3 is a sealing resin 11a which makes it possible to strengthen the mechanical bond between the chip 2 and the package 3 and which furthermore enters the orifice 24 and its axial grooves 24a so as to fix the end 23 of the fiber 22 to the wall 6 of the package 3. Of course, the sealing resin 11a is chosen so as to be transparent to the light signals being exchanged between the optical fiber 22 and the receiving diode 19.

The semiconductor device 1 may be fabricated in the following manner. First of all, the hole 24 in the wall 6 of the package 3 is produced, for example by ultrasonic etching. The chip 2 is soldered to the wall 6 by means of the connection balls 10. The end 23 of the optical fiber 22 is fitted into the through-orifice 24. The sealing and bonding resin 11a is injected into the space 11 separating the chip 2 from the wall 6 of the package 3 and, after this resin has polymerized and cured, the encapsulation is carried out by fixing the lid 5 of the package 3 to its holder 4.

Figure 3:
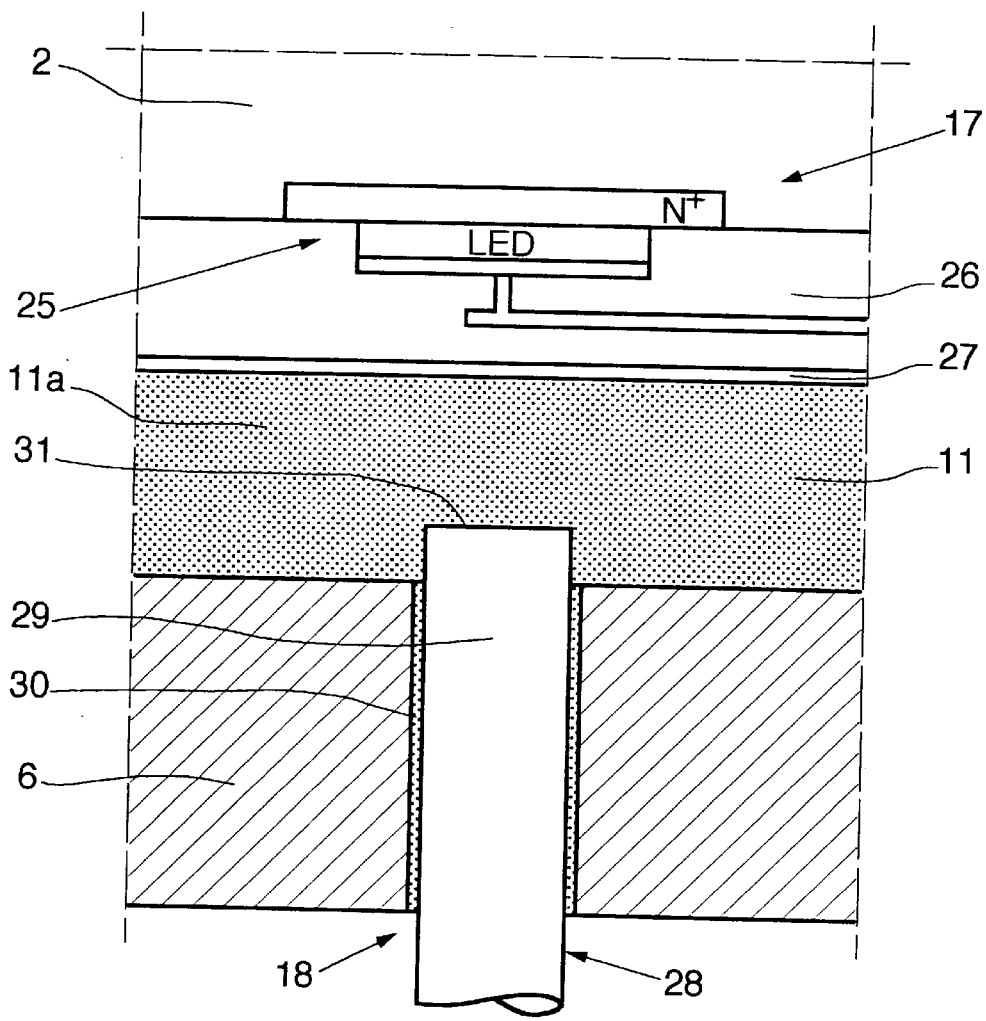
FIG. 3 represents an enlarged section of FIG. 1, showing a second embodiment of the semiconductor device according to an embodiment of the invention.

It may be seen in the embodiment in FIG. 3 that the part 17 of the exchange means 16 comprises a light-signal emitter, in particular consisting of a light-emitting diode 32 obtained, in particular, by heteroepitaxy of Group III–V materials, in particular GaAs, constituting a final component integrated into the chip 2 in the direction of its thickness, to the rear of an insulating layer of silicon dioxide 26 and of a passivating final layer 27.

As in the embodiment in FIG. 2, the part 18 of the exchange means 16 comprises an optical fiber 28, the end part 29 of which is engaged and fixed in an orifice 30 passing through the wall 6 of the package 3. The end 31 of the optical fiber 28, lying in the separating space 11, is capable of picking up the light signals emitted by the emitting diode 32 integrated into the chip 2 across the space 11 separating the chip 2 from the wall 6 of the package 3.

The light signals picked up by the fixed end 31 of the optical fiber 28 are transmitted by the latter as far as its other end, outside the package 3, which may be connected to a light-signal receiver.

It should be noted that the light-signal-exchange means 16 which have just been described with reference to FIGS. 2 and 3 have no DC link and therefore generate no parasitic effect resulting from the usual input/output mechanical conduction connections, thus making it possible to omit at least some of the protection circuits usually integrated into the chip 2. Furthermore, it allows data input and/or output at very high rates.

The chip 2 could comprise several emitting and/or receiving diodes, the wall 6 of the package 3 bearing, opposite each other, the same number of fibers optically coupled to the diodes.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor device comprising:
   a chip forming an integrated circuit;
   a connection substrate having an external coupling means electrically coupling to a device other than the chip, the external coupling means including at least one of: a plurality of coupling pads distributed in the form of a matrix on the surface of the connection substrate opposite the chip, and a plurality of coupling balls distributed in the form of a matrix on the surface of the connection substrate opposite the chip;
   internal coupling means electrically coupling the integrated circuit to the external coupling means; and
   at least one light-signal-exchange means for communicating comprising:
      a first optoelectronic part, integrated into the chip and constituting one component of the integrated circuit, comprising a device selected from the group consisting of an emitter and a receiver; and
      a second optoelectronic part including at least one optical fiber, the second optoelectronic part being borne by the connection substrate such that the optical fiber is engaged in an orifice passing through the connection substrate, and being able to be externally connected to the connection substrate, wherein the second optoelectronic part faces the first optoelectronic part and is capable of exchanging light signals with the first optoelectronic part.

2. The semiconductor device of claim 1, wherein the internal coupling means comprises a plurality of coupling points, distributed in the form of a matrix, provided between the juxtaposed faces of the chip and of the connection substrate.

3. The semiconductor device of claim 1, wherein the internal coupling means comprises a plurality of coupling balls, distributed in the form of a matrix, provided between the juxtaposed faces of the chip and of the connection substrate.

4. The semiconductor device of claim 1, wherein the chip comprises the internal coupling means.

5. The semiconductor device of claim 2, wherein the light-signal exchange means is located in a region having no coupling points.

6. The semiconductor device of claim 3, wherein the optical fiber includes:

a first end part which is engaged through the orifice passing through the connection substrate and formed so as to couple, optically and remotely, the first end part of the one optical fiber to the first optoelectronic part, through the space separating the chip from the connection substrate; and a second end part which is capable of being optically coupled to a device which is external to the semiconductor device, the external device being selected from the group consisting of an emitter and a receiver.

7. The semiconductor device of claim 6, further comprising a plurality of optical fibers.

8. The semiconductor device of claim 6, wherein the orifice extends perpendicularly to the space separating the chip from the connection substrate.

9. The semiconductor device of claim 6, wherein the orifice has axial grooves in its wall.

10. The semiconductor device of claim 6, wherein the optical fiber is adhesively bonded in the orifice to the connection substrate.

11. The semiconductor device of claim 6, further comprising a sealing resin which has been injected into the space separating the chip from the substrate and is transparent to the light signals, the resin adhesively bonding the optical fiber to the connection substrate.

12. The semiconductor device of claim 1, wherein the first optoelectronic part constitutes, in the thickness direction of the chip, a final component of the integrated circuit.

13. The semiconductor device of claim 1, wherein the external coupling means comprises a plurality of coupling pads distributed in the form of a matrix on the surface of the connection substrate opposite the chip.

14. The semiconductor device of claim 1, wherein the external coupling means comprises a plurality of coupling balls distributed in the form of a matrix on the surface of the connection substrate opposite the chip.

15. The semiconductor device of claim 3, wherein the external coupling means comprises:

a plurality of coupling balls distributed in the form of a matrix on the surface of the connection substrate opposite the chip; and a plurality of coupling lines which electrically couple the plurality of coupling balls in the internal coupling means to the plurality of coupling balls in the external coupling means.

16. The semiconductor device of claim 1, wherein the connection substrate constitutes one portion of a wall of a package for encapsulating the chip.

17. A semiconductor device comprising:

a chip forming an integrated circuit, comprising:
a contact face; and
an optoelectronic part, integrated into the chip and constituting one component of the integrated circuit, comprising a device selected from the group consisting of an emitter and a receiver;

a first plurality of coupling balls, distributed in the form of a matrix on the contact face of the chip;

a connection substrate comprising:
a first face which faces the contact face of the chip, and is electrically coupled to the first plurality of coupling balls;
a second face which faces away from the chip; and
a plurality of coupling lines, embedded within the connection substrate, which electrically couple the first plurality of coupling balls to the second face of the connection substrate;

a second plurality of coupling balls distributed in the form of a matrix on the second face of the connection substrate, and electrically coupled to the plurality of coupling lines; and an optical fiber comprising:
a first end which is engaged through an orifice passing through the connection substrate and formed so as to couple, optically and remotely, the first end of the optical fiber to the optoelectronic part, through the space separating the chip from the connection substrate; and
a second end which is capable of being optically coupled to a device, external to the semiconductor device, selected from the group consisting of an emitter and a receiver.

18. A method for forming a semiconductor device, wherein the semiconductor device comprises a chip forming an integrated circuit, and a connection substrate, the method comprising the steps of:

coupling, electrically and physically, the integrated circuit to the connection substrate;

providing an electrical interface on the connection substrate for devices external to the semiconductor device;

coupling, electrically, the electrical interface to the integrated circuit; and coupling, optically, the chip and the connection substrate by:
integrating into the chip, as a component of the integrated circuit, a first optoelectronic part selected from the group consisting of an emitter and a receiver; and
providing a second optoelectronic part including at least one optical fiber, the second optoelectronic part being borne by the connection substrate such that the optical fiber is engaged in an orifice passing through the connection substrate, and being able to be externally connected to the connection substrate, wherein the second optoelectronic part faces the first optoelectronic part and is capable of exchanging light signals with the first optoelectronic part.

* * * * *